(12) United States Patent
Goller et al.

(10) Patent No.: US 7,276,783 B2
(45) Date of Patent: Oct. 2, 2007

(54) ELECTRONIC COMPONENT WITH A PLASTIC PACKAGE AND METHOD FOR PRODUCTION

(75) Inventors: Bernd Goller, Otterfing (DE); Robert Christian Hagen, Sarching (DE); Gerald Ofner, Bad Abbach (DE); Christian Stuempfl, Schwandorf (DE); Josef Thumbs, Breitenbrunn (DE); Stefan Wein, Lappersdorf (DE); Holger Woerner, Regensburg (DE)

(73) Assignee: Infineon Technologies AG, Neubiburg (DE)

( * ) Notice: Subject to any disclaimer, the term of this patent is extended or adjusted under 35 U.S.C. 154(b) by 645 days.

(21) Appl. No.: 10/484,443

(22) PCT Filed: Jul. 31, 2002

(86) PCT No.: PCT/DE02/02811
§ 371 (c)(1),
(2), (4) Date: Jan. 29, 2004

(87) PCT Pub. No.: WO03/015165
PCT Pub. Date: Feb. 20, 2003

(65) Prior Publication Data
US 2004/0232543 A1    Nov. 25, 2004

(30) Foreign Application Priority Data
Jul. 31, 2001   (DE) ................. 101 37 184

(51) Int. Cl.
H01L 23/02    (2006.01)
(52) U.S. Cl. ....................................... 257/678
(58) Field of Classification Search ............ 257/678
See application file for complete search history.

(56) References Cited

U.S. PATENT DOCUMENTS

| | | |
|---|---|---|
| 5,496,775 A | 3/1996 | Brooks |
| 5,834,340 A | 11/1998 | Sawai et al. |
| 5,892,288 A | 4/1999 | Muraki et al. |
| 5,892,299 A | 4/1999 | Siewert et al. |
| 5,923,954 A | 7/1999 | Cho |

(Continued)

FOREIGN PATENT DOCUMENTS

JP        08070081 A       3/1996

(Continued)

OTHER PUBLICATIONS

Winderl J et al. "Waverlevelassembly unter Berucksichtigung einer Chipkanterstruktur mit verbesserter Zuverlassigkeit fur Bare-Die-Packages (BDP) und micro Bare-Die-Packages (μBDP)" Technik Report, Siemens AG., Er DE, vol. 3, NR 8, pp. 27-28, 2000.

Primary Examiner—Carl Whitehead, Jr.
Assistant Examiner—Monica D. Harrison
(74) Attorney, Agent, or Firm—Edell, Shapiro & Finnan, LLC (57) ABSTRACT

An electronic component with a plastic package and to a method for its production, includes a semiconductor chip. An underside of the plastic package has external contacts. The external contacts are connected to contact areas on an active upper side of the semiconductor chip by contact pillars of the semiconductor chip and wiring lines arranged on the plastic package molding compound. In this case, the contact pillars represent an electrically conducting elevation of the contact areas.

36 Claims, 9 Drawing Sheets

U.S. PATENT DOCUMENTS

| | | |
|---|---|---|
| 5,977,641 A | 11/1999 | Takahashi et al. |
| 5,989,982 A | 11/1999 | Yoshikazu |
| 5,990,546 A | 11/1999 | Igarashi et al. |
| 6,031,284 A | 2/2000 | Song |
| 6,054,772 A | 4/2000 | Mostafazadeh et al. |
| 6,476,503 B1 | 11/2002 | Imamura et al. |
| 6,607,970 B1 | 8/2003 | Wakabayashi et al. |
| 2004/0014317 A1 | 1/2004 | Sakamoto et al. |

FOREIGN PATENT DOCUMENTS

| | | |
|---|---|---|
| JP | 08330472 A | 12/1996 |
| JP | 2001/110828 AA | 4/2001 |
| WO | WO9425987 | 11/1994 |

ELECTRONIC COMPONENT WITH A PLASTIC PACKAGE AND METHOD FOR PRODUCTION

CROSS-REFERENCE TO RELATED APPLICATIONS

This application claims priority under 35 USC § 119(e) to German Application No. DE 10137184.5, filed on Jul. 31, 2001, and titled "Electronic Component With a Plastic Package and Method For Its Production," the entire contents of which are hereby incorporated by reference.

FIELD OF THE INVENTION

The invention relates to an electronic component with a plastic package and to a method for its production.

BACKGROUND

The increasing complexity of the production of electronic components comprising a plastic package with a semiconductor chip and external contacts distributed on the underside of the plastic package is increasingly leading to a higher number of rejects in the production of electronic components of this type. As a result, there is a rise in the production costs for such electronic components with an increasing number of external contacts on its underside.

SUMMARY

It is an object of the invention to provide an electronic component and a method for its production with which, in spite of increasing complexity and an increasing number of external terminals, the reject rate is reduced and it can nevertheless be produced inexpensively.

Intensive investigations have shown that a major reason for the production of complex components with a plastic package becoming more expensive is the large number of mounting techniques for all possible forms of package, since there is no standard technology platform. The technologies for the production of different packages and families of packages have so far been completely different. Furthermore, the use of interposers and defined chip carriers and other system carriers appears to be indispensable. In particular, however, the technically complex wiring function of an interposer entails a constant functional risk. In the case of the electronic component with a plastic package according to the invention, it is possible to dispense entirely with the use of an interposer.

According to the invention, an electronic component has a plastic package, in which a semiconductor chip is arranged. The plastic package has side edges, which are arranged around side edges of the semiconductor chip. In this case, on the active upper side of the semiconductor chip and on the side edges of the plastic package there is formed a thin electrically insulating layer of plastic with a thickness of up to about 30 µm. The layer of plastic may in this case have a thickness of up to 20 µm, allowing very small components to be produced. The production method according to the invention specifically allows such components to be produced very easily and reliably.

The layer of plastic may in this case be produced from the plastic molding compound used for producing the package. The underside of the plastic package has external contacts, which are connected to contact areas on an active upper side of the semiconductor chip by means of wiring lines. The wiring lines are in this case arranged in one or more wiring planes. The layer of plastic may in this case be made very thin and even as a thin passivation layer on the semiconductor chip, when it provides an electrically insulating effect.

This electronic component has the advantage that it offers a low-cost package alternative for forms of construction which are highly integrated and have a high number of poles, without the use of multi-layered substrates and additional interposers. At the same time, the contact pillars, which represent an electrically conducting elevation of the contact areas on the active upper side of the semiconductor chip, bring about a new mounting technique as a technology platform for all possible forms of package. The production of contact pillars on the contact areas of the semiconductor chip embedded in a plastic package molding compound provides a new technology for the production of various packages and families of packages, with the basic structures remaining the same.

With the electronic component according to the invention, highly integrated components can be produced in future technologies, such as the fan-out designs, in just the same way as low-pin-count applications with high performance requirements up to wafer-level packages. Such an electronic component also at the same time overcomes the difficulty that until now different forms of package have always required new concepts for production lines and consequently a wide variety of equipment, processes and materials, which is no longer necessary with the electronic component according to the invention. The different approaches adopted for packages, including in the field of application of high-frequency technology and the high-pin-count packages, such as the P-LFBGA package, can be standardized and simplified on the basis of the electronic component according to the invention.

Between the layer of plastic and the wiring plane or between the layer of plastic and one of the wiring planes there may also be provided at least one further electrically insulating intermediate layer. For certain applications, further advantages may arise from this with regard to mechanical or electrical properties of the component according to the invention.

Components with particularly small semiconductor chips can still be electrically bonded well if external contacts are arranged in regions underneath the side edges of the plastic package. With this embodiment of the invention, the number of external contacts can also be increased as desired, by making the side edges of the plastic package molding compound larger to any desired extent than the side edges of the semiconductor chip.

The external contacts may in this case also be connected to contact areas on the active upper side of the semiconductor chip by means of contact pillars of the semiconductor chip and by means of wiring lines arranged on the plastic package molding compound. Then, the contact pillars are formed as an electrically conducting elevation of the contact areas.

In one refinement of the invention, it is provided that the rear side of the semiconductor chip is arranged on the upper side of the plastic package and has an external contact area for a ground potential. This external contact area may also be used for the connection of a heat conduction block or a cooling device. One advantage of this electronic component is that not only are external contacts arranged on the underside of the electronic component but a central external contact area is now also offered on the upper side of the electronic component.

In the case of a further embodiment of the invention, the rear side of the semiconductor chip is arranged under the upper side of the plastic package and is covered by a coating of plastic package molding compound. This embodiment of the invention has the advantage that the rear side of the semiconductor chip is protected from mechanical damage by the coating of plastic package molding compound.

In the case of the electronic component according to the invention, the wiring lines may at least partly rest directly on the plastic package molding compound. According to a development, any risk resulting from the wiring lines also being wetted by the material of the external contacts during the application of external contacts on external contact areas can be avoided in a simple way by a solder resist layer being provided on the underside of the electronic component, in which layer external contact areas of the external contacts remain free.

The external contacts themselves may be formed as solder balls or solder bumps. Solder balls and solder bumps of this type have the advantage that they can be arranged on the entire underside of the plastic package, provided that a corresponding number of external contact areas are arranged on the underside of the electronic component.

In the case of a further embodiment of the invention, a multi-layered interconnect structure may be arranged on the plastic package molding compound. This multi-layered interconnect structure serves for the wiring of the contact pillars of the semiconductor chip to the external contacts provided. This embodiment of the invention additionally has the advantage that the multi-layered interconnect structure can be built up on contact pillars of the semiconductor chip which are embedded in plastic package molding compound and the upper sides of which remain free of plastic molding compound, with the result that the lowermost interconnect layer of the multi-layered interconnect structure rests directly on the plastic package molding compound and is connected to the contact pillars of the semiconductor chip.

A method for producing an electronic component with a plastic package in which a semiconductor chip is arranged has the following method steps. Firstly, a semiconductor wafer which has semiconductor chips, with contact areas, arranged in rows and columns is provided. Subsequently, the contact areas are elevated to form contact pillars on the semiconductor wafer. After the elevation of the contact areas in the form of pillars, the semiconductor wafer can be separated into individual semiconductor chips. A mold plate is then loaded with these semiconductor chips. Subsequently, a common carrier is produced on this mold plate from plastic package molding compound, the semiconductor chips being embedded into the plastic package molding compound in such a way that the upper sides of the contact pillars lying opposite from the contact areas of the semiconductor chips are arranged such that they remain free on the upper side of the carrier. On the upper side of the semiconductor carrier, wiring lines can then be selectively applied to the common carrier, one line end of a wiring line in each case being connected to an exposed upper side of a contact pillar and the other line end leading to an external contact area. Apart from these external contact areas, the upper side of the carrier can then be coated by selectively applying a solder resist, with the result that the wiring lines lying on the upper side remain protected against being wetted by the material of the external contacts to be applied. Finally, solder balls or solder bumps may be applied to the exposed external contact areas. Subsequently, the carrier is separated into individual electronic components.

This method has the advantage that it offers a technology platform for all possible forms of package. In this case, the technology for producing various packages and families of packages always remains the same. In the case of this method for producing an electronic component, it is possible to dispense with the use of interposers or defined chip carriers. With the method, any desired pin design can be created.

Even highly integrated components can be produced in future technologies, such as the fan-out designs, in just the same way as low-pin-count applications with high performance requirements up to wafer-level packages.

With the method according to the invention, complex wiring functions of a customary interposer can be replaced completely. Finally, the method according to the invention provides a low-cost package alternative for forms of construction which are highly integrated and have a high number of poles, without the use of multi-layered substrates and additional interposers. With these methods, both single-layered wirings directly on the carrier of plastic package molding compound and multi-layered structures are possible. Any desired terminal patterns on the underside of the electronic component can also be produced by this method. For different packages, such as for example VQFN or P-LFBGA packages, there is technologically no difference. Consequently, the method according to the invention and the associated processes are package-independent.

A continuation of the method according to the invention provides that the underside of the semiconductor wafer is provided with a coating of plastic package molding compound before the separation into semiconductor chips. This has the advantage that firstly an entire semiconductor wafer is provided on its underside with a plastic package molding compound, with the result that, after the separation into individual semiconductor chips, the latter are already provided with a plastic package molding compound on their rear side. The embedding of the rear side, and consequently protection of the rear side, by the plastic package molding compound, has then already taken place before further processing of the chip to form an electronic component takes place.

In a further implementational example of the method, the elevation of the contact areas in the form of pillars to form contact pillars on the semiconductor chip, and consequently on the semiconductor wafer, takes place by metal deposition through a mask. After pulling off the mask, metallic pillar-shaped elevations are left standing on the contact areas of the respective semiconductor chips of the semiconductor wafer.

The elevation of the contact areas in the form of pillars to form contact pillars on the semiconductor chip may also take place by selective electrolytic metal deposition through a mask. For this purpose, firstly a closed metal layer of less than 1 µm is applied on the semiconductor wafer. Subsequently, a mask is either printed onto the wafer or applied by a photoresist technique and finally a cathode potential of an electrodepositing installation is applied to the continuous metal layer, with the result that contact pillars are deposited galvanically or electrolytically on the contact areas on the semiconductor wafer which are kept free by the mask. The mask is subsequently removed. This may take place, for example, by incineration in a plasma furnace or by solvents which wash away the mask, and the thin connecting metal layer is subsequently etched away by brief etching, with the result that the individual contact pillars are no longer short-circuited. This implementational example has the advantage that it is an extremely inexpensive variant which is suitable for the mass production of contact pillars on a semiconductor wafer.

For the elevation of the contact areas in the form of pillars to form contact pillars on the semiconductor chip, printing techniques may also be used. Printing techniques of this type have the advantage that no mask which is subsequently destroyed has to be applied directly on the semiconductor wafer. Rather, a permanent stencil or mask can be used, through which printing of the contact pillars can take place. The printing operation itself requires only a short process time, with the result that it is also suitable for mass production.

The elevations of the contact areas in the form of pillars to form contact pillars on the semiconductor chip may also take place using metal sputtering through a mask. This metal sputtering takes place by a metallic source being atomized, for example by electron beams or inert ion beams, and these atomized metal ions subsequently being sputtered in the direction onto a wafer at cathode potential. This sputtering may take place through a mask, or else a closed metal area may be produced and subsequently structured with the aid of a photoresist technique to form contact pillars.

Instead of a sputtering technique, it is also possible to use a vapor-depositing technique, in which a metal source is vaporized and this metal vapor coats the upper side of the semiconductor wafer. This coating may in turn take place through a mask or a mask may be subsequently applied, in order selectively to form only the metal pillars on the semiconductor chip or semiconductor wafer.

Finally, the elevations of the contact areas in the form of pillars to form contact pillars may also be produced by means of applying bonding heads. Bonding heads of this type may be thermosonic compression heads, in the case of which a gold wire is formed into a pillar-shaped head. These elevations in the form of pillars have the advantage that they can produce any desired elevations of the contact areas. The further advantage of this elevation is that they form on the semiconductor chip a contact pillar that is dimensionally very stable.

After producing the contact pillars, the semiconductor wafer can be packaged in a plastic package molding compound. If the underside of the electronic component is made much larger than the surface area of an individual chip, firstly the semiconductor wafer is separated into individual semiconductor chips. After separation, the chips can be applied at any distance from one another in rows and columns on a mold plate. Once the mold plate has been loaded, the entire mold plate may be coated with a plastic package molding compound, the semiconductor chips being embedded together into the plastic package molding compound. The upper sides of the contact pillars are in this case still freely accessible on the upper side of the carrier of plastic package molding compound. This has the advantage that wiring lines for many semiconductor chips can subsequently be applied at the same time directly on the plastic package molding compound. Furthermore, it has the advantage that any number of external contacts can be placed on the underside of the electronic component, by providing a corresponding number of contact terminal areas by means of wiring lines on the carrier of plastic package molding compound.

In a further implementational example of the method, selective application of wiring lines on the common carrier of plastic package molding compound takes place by applying a closed metal layer and subsequent structuring of the metal layer by a photoresist technique. This method has the advantage that, by means of sputtering metal or vapor-depositing metal or currentlessly depositing metal, a closed metal layer is firstly formed on the upper side of the carrier of a plastic package molding compound, initially short-circuiting all the upper sides of the contact pillars, and this layer is subsequently precisely structured by a precision photoresist technique to form wiring lines or to form interconnects.

According to the method, the structure of the interconnects may also be produced by a direct printing technique such as a screen printing technique. In this case, a screen which has open meshes only at the points at which wiring lines are to be produced is used. This screen printing technique is extremely inexpensive and can consequently reduce the overall costs of the method.

Before providing external contacts on the contact areas which are arranged at the ends of the wiring lines, a solder resist is selectively applied to the upper side of the carrier while leaving the external contact areas of the wiring lines free, for example, by a photoresist technique. This solder resist covers the wiring lines and protects them from being wetted by the external contacts to be provided.

Instead of a single-layered wiring level, it is also possible if circumstances require for multi-layered interconnect structures to be applied on the upper side of the carrier of plastic package molding compound. For this purpose, contact vias are provided between the interconnect layers, in order to connect the individual interconnect levels to one another to the extent required. The production of multi-layered interconnect structures of this type can be carried out by methods of microtechnology and/or printed circuit board technology. This has the advantage that such technologies have been tried and tested and, consequently, inexpensive, tried-and-tested methods are used and the production risk is therefore minimized.

To sum up, with the electronic component according to the invention and the method, a new mounting technique is possible as a technology platform for all possible forms of package. In this case, the technology for producing various packages and families of packages always remains the same. In spite of this, every pin design can be created. Highly integrated components can be produced in future technologies, such as the fan-out designs, in just same way as low-pin-count applications with high performance requirements up to wafer-level packages.

With the electronic component according to the invention and the method, complex wiring functions of an interposer are no longer necessary. Low-cost package alternatives for types of construction which are highly integrated or have a high number of poles are possible without the use of multi-layered substrates and possibly additional interposers. What is more, the electronic component and the method according to this invention have the advantage that wire bonding or flip-chip bonding are completely unnecessary. Consequently, with the present invention, multi-layered structures are possible in just same way as single-layered wiring arrangements. Furthermore, any desired terminal patterns can be produced and there is technologically no difference between different packages. Consequently, the method according to the invention and the processes associated with it are package-independent.

BRIEF DESCRIPTION OF THE FIGS

The invention is now explained in more detail on the basis of several exemplary embodiments with reference to the accompanying drawings.

DETAILED DESCRIPTION

Figure 1:
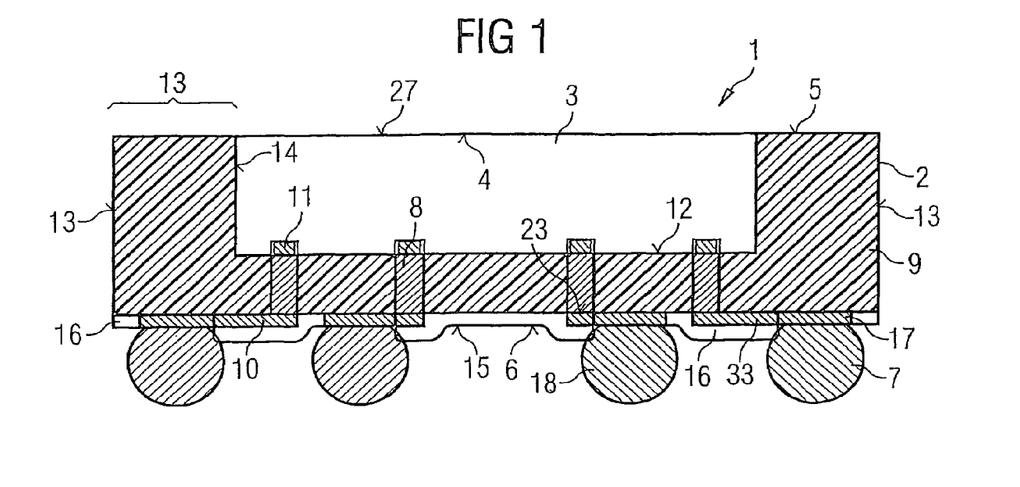
FIG. 1 shows a schematic cross section through a first electronic component according to the invention.

FIG. 1 shows a schematic cross section through an electronic component 1 according to a first embodiment of the invention. The electronic component 1 is divided into a plastic package 2 and a semiconductor chip 3, which has a rear side 4 and an active upper side 12. The plastic package 2 has an upper side 5 and an underside 6. Arranged on the underside 6 are external contacts 7. These external contacts 7 are electrically connected to contact areas 11 on the active upper side of the semiconductor chip 3 by wiring lines 10 in a wiring plane 33 and by contact pillars 8.

The contact pillars 8 are formed as metallic elevations of the contact areas 11 on the upper side 12 of the semiconductor chip 3. The contact pillars 8 have a length, and consequently an elevation, of between 5 μm and 150 μm. The contact pillars 8 are made of copper, gold or alloys of the same. In the case of the first embodiment of the invention, the wiring lines 10 rest directly on the plastic package molding compound 9 and with one end electrically bond the upper side 23 of a contact pillar 8. The wiring lines 10 have at their other end an external contact area 17, on which an external contact 7 is respectively arranged. The circumferential surfaces of the contact pillars 8 are completely embedded in plastic package molding compound. In this embodiment, the side surfaces of the semiconductor chip and the upper side of the semiconductor chip is surrounded by plastic package molding compound 9 in such a way that side edges 13 of plastic package molding compound 9 are formed on the electronic component 1.

Variation of the width of the side edges 13 allows outer areas of any desired size to be provided on the electronic component 1, independently of the chip size of the semiconductor chip 3, for arranging external contact areas or for arranging external contacts 7. In the first embodiment of the invention, shown in FIG. 1, only a single wiring level 33 is arranged on the underside 6 of the plastic package 2. On this wiring level, a solder resist 16 is provided, leaving the external contact areas 17 free, in order to restrict wetting of the solder balls 18, as external contacts 7, to the external contact areas 17 themselves.

In the case of this embodiment of the invention, neither leadframes nor wiring boards are used, and there is no wire bonding connection or flip-chip contact-making at all on the upper side 12 of the semiconductor chip, with the result that this electronic component has a simple and compact construction, which creates extremely reliable electrical connections between macroscopic external contacts 7 and microscopically small contact areas 11. Microscopically small is to be understood here as meaning areas and dimensions which can only be measured under an optical microscope, while macroscopic components can be perceived with the naked eye and can be measured with appropriate measuring tools.

The semiconductor chip 3 in the embodiments of the invention has a chip thickness of between 100 μm and 750 μm and a size of between 2.5 mm and 25 mm edge length.

Figure 2:
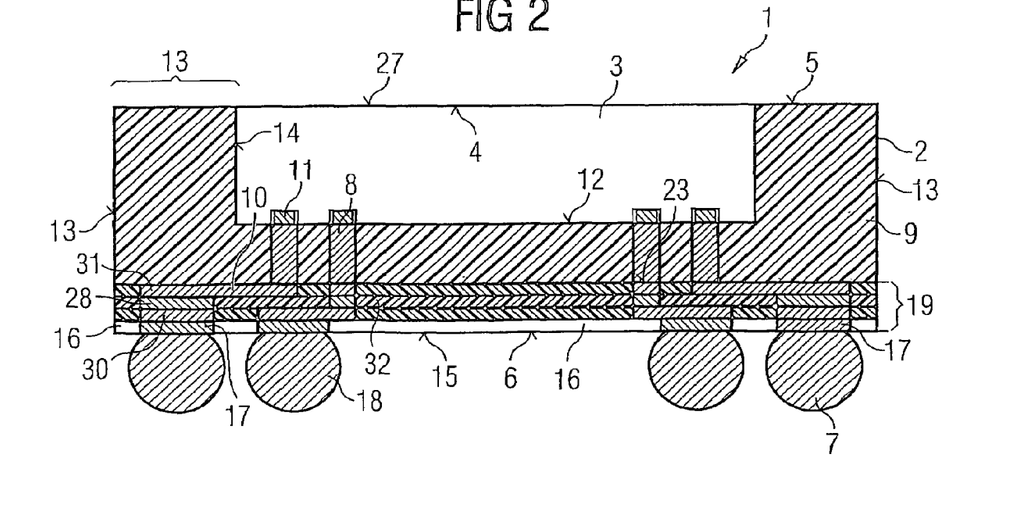
FIG. 2 shows a schematic cross section through a second electronic component according to the invention.

FIG. 2 shows a schematic cross section through an electronic component 1 according to a second embodiment of the invention. Components with the same functions as in FIG. 1 are designated by the same reference numerals and are not separately explained.

One difference between the first embodiment according to FIG. 1 and the second embodiment according to FIG. 2 is that not a single wiring planes but a number of wiring planes are arranged on the underside 6 of the plastic package of the second embodiment according to FIG. 2. In the second embodiment, an outer wiring plane 30 is provided, covered by a solder resist apart from the external contact areas 17. What is more, an inner wiring plane 31 is provided, covered by an insulating layer 32 apart from the region of the external contacts 17. The insulating layer 32 is in this case in the form of a polyimide layer. In the regions of the external contact areas 17, contact vias 28 lead through the polyimide layer, in order to connect the external contacts 7 to the inner wiring plane 31.

Depending on the number and density of the contact areas 11 on the active upper side 12 of the semiconductor chip 3, it is also possible with the second embodiment for virtually any number of external contacts 7 to be arranged on the underside 15 of the electronic component 1. Not only a two-layered interconnect structure, as is shown in FIG. 2, but also multi-layered interconnect structures 19 can be produced on the plastic package molding compound 9.

Figure 3:
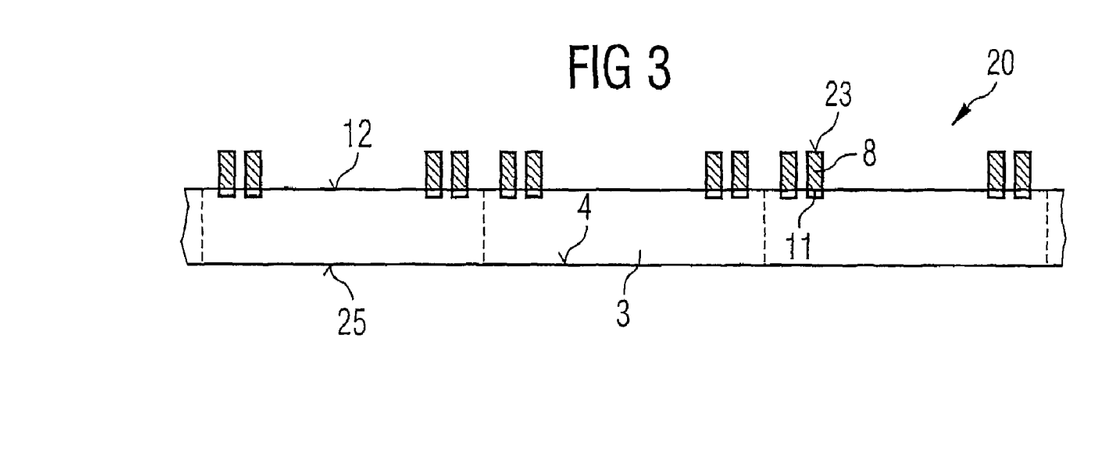
FIG. 3 shows a schematic cross section through a semiconductor wafer, with contact pillars applied on contact areas.

FIG. 3 shows a schematic cross section through a semiconductor wafer 20 with contact pillars 8 applied on contact areas 11 in the course of production of the first or second embodiment of the invention. Components with the same functions as in the previous figures are designated by the same reference numerals and are not separately explained. The starting point for the production of an electronic component 1, as is shown in FIGS. 1 and 2, is a semiconductor wafer, which has on its upper side a number of integrated circuits which are arranged in rows and columns to form semiconductor chips. The electrodes of the individual structural elements of each integrated circuit are connected by microscopically small contact areas on the upper side of each semiconductor chip. These contact areas 11 are consequently arranged on the upper side of the semiconductor wafer 20.

According to FIG. 3, in the course of the production of a component according to the invention, firstly an elevation of the contact areas 11 in the form of pillars takes place to form contact pillars 8 on the semiconductor wafer 20. This extension in the form of pillars takes place by a thin metal area firstly being deposited on the upper side 12 of the semiconductor wafer 20 and this metal layer of a few micrometers in thickness subsequently being provided with an insulating mask, which leaves only the contact areas 11 free. Subsequently, the semiconductor wafer is immersed in a galvanic or electrolytic bath for the metal-depositing of the contact pillars, with electrical bonding of the continuous thin metal layers.

After the contact pillars have been formed in the openings of the insulating mask, this mask is removed, for example, by incineration in a plasma furnace or by dissolving by appropriate solvents. Consequently, the contact pillars 8 are exposed and are electrically connected merely by a thin metal layer, which can be etched away from the surface of the plastic package molding compound by a brief etching operation. The removal of the elevation of the contact pillars and the simultaneous incipient etching of the circumferential region of the contact pillars can be accepted in this case, with the result that no extra protection or extra mask is required for the contact pillars in the case of this etching operation.

Another possibility, not shown in this view, of building up a pillar structure of this type on the contact areas 11 is that of metal-depositing through a mask. The metal-depositing is in this case carried out by a vapor-depositing technique or metal sputtering. In this case, copper, gold or alloys of the same are used as the metal to be deposited.

A further possibility for forming pillars, in particular very high or long pillars, for example over 50 μm, is to apply bonding heads, preferably thermosonic compression heads, to the contact areas. These thermosonic compression heads or bonding heads are mechanically extremely stable and can be applied already on the entire wafer for all the semiconductor chips.

Figure 4:
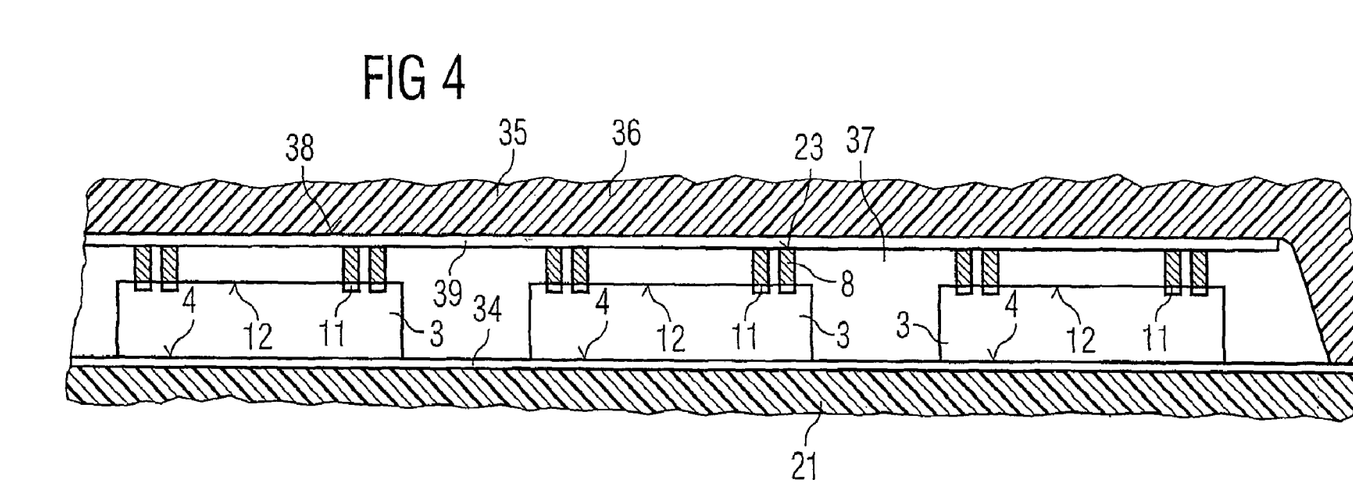
FIG. 4 shows a schematic cross section through a number of semiconductor chips produced on the semiconductor wafer according to FIG. 3, with contact pillars applied on contact areas.

FIG. 4 shows a schematic cross section through a number of semiconductor chips 3 with contact pillars 8 applied on contact areas 11, which are arranged on a mold plate 21. Components with the same functions as in the previous figures are designated by the same reference numerals and are not separately explained.

For receiving the semiconductor chips 3, the mold plate 21 is provided with a double-sided adhesive film 34. The mold plate 21 at the same time forms part of an injection mold, which is divided into two The second mold part 36 is applied after arranging the semiconductor chips 3 on the mold plate 21, the second mold part 36 having on the upper inner wall 38 of its mold cavity 37 a sealing film 39, into which the contact pillars 8 can work themselves with their upper sides 23. This sealing film 39 has at the same time the effect of compensating for height tolerances of the contact pillars 8 with respect to one another.

Figure 5:
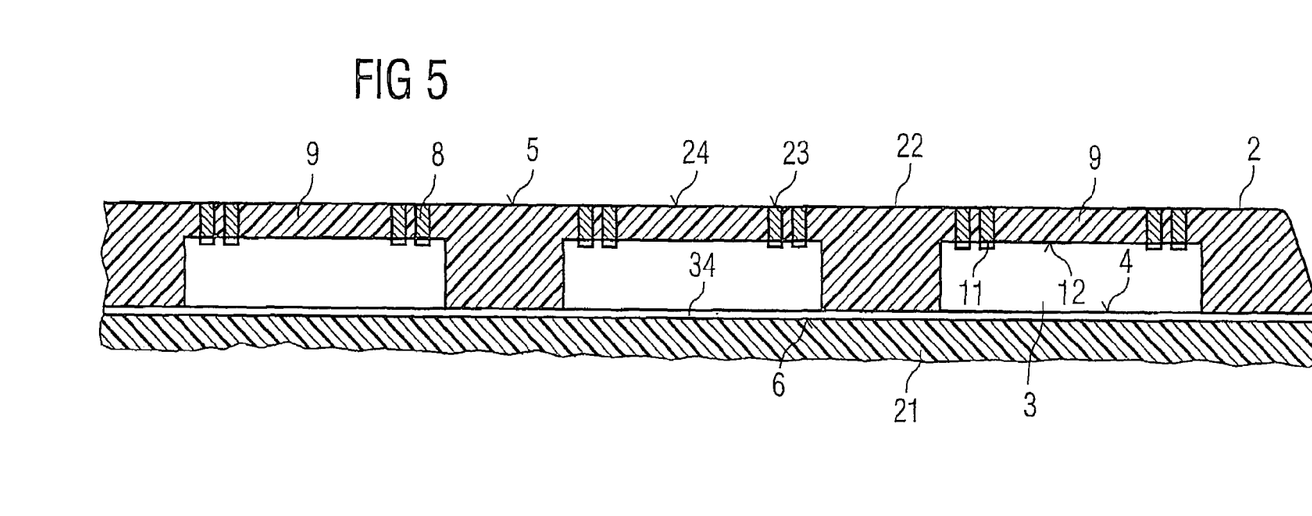
FIG. 5 shows a schematic cross section through a carrier of plastic package molding compound, with embedded semiconductor chips according to FIG. 4.

FIG. 5 shows a schematic cross section through a carrier 22 of plastic package molding compound 9 with embedded semiconductor chips 3. Components with the same functions as in the previous figures are provided with the same reference numerals and are not separately explained.

The carrier 22 of plastic package molding compound 9 has been produced by filling the mold cavity 37 of an injection mold 35, as is shown in FIG. 4. In this case, the upper sides 23 of the contact pillars 8 are freely accessible on the upper side 24 of the carrier 22. On the upper side 24 of the carrier 22 there may now be arranged a single wiring plane, as provided for the first embodiment of the invention according to FIG. 1, or a multi-layered interconnect structure, as provided for the second embodiment of the invention according to FIG. 2. In this case, the mold plate 21 can support the carrier 22. The carrier 22 is self-supporting, with the result that the mold plate 21 can be removed before wiring planes are applied. The carrier 22 of plastic package molding compound 9 has component positions arranged in rows and columns, with in each case an embedded semiconductor chip 3 and associated contact pillars 8.

Figure 6:
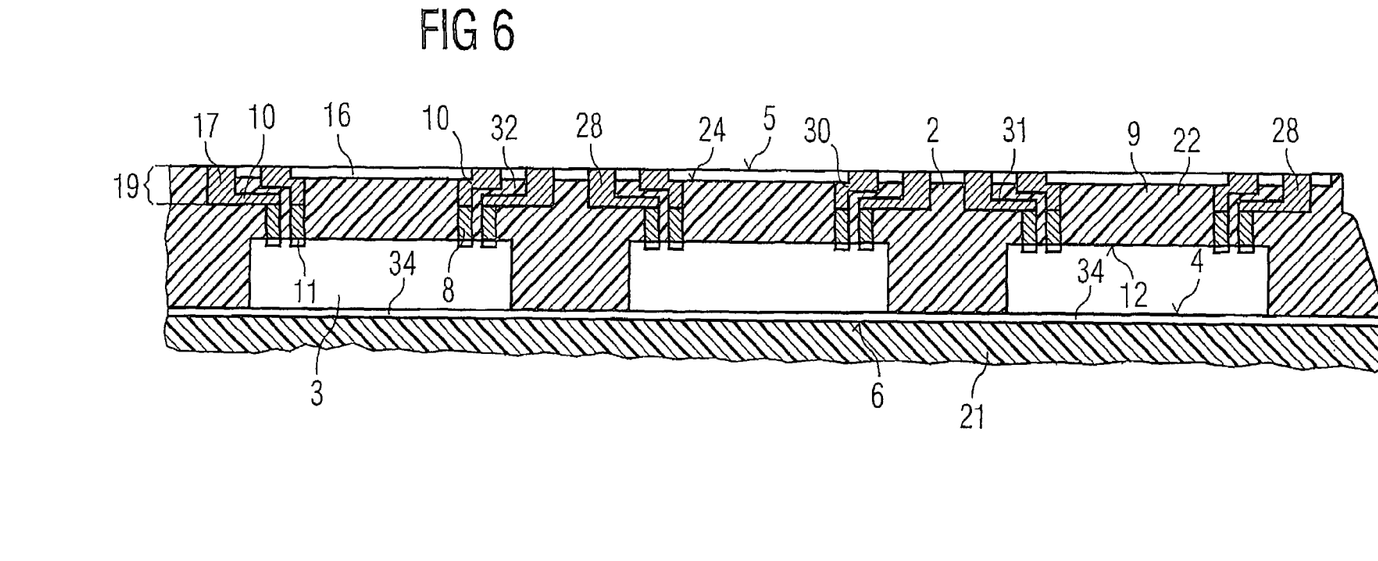
FIG. 6 shows a schematic cross section through the carrier from FIG. 5, after wiring lines have been provided on it.

FIG. 6 shows a schematic cross section through a carrier 22 of plastic package molding compound 9 with wiring lines 10 and contact vias 28 arranged on the carrier 22. Components with the same functions as in the previous figures are designated by the same reference numerals and are not separately explained.

The wiring lines in FIG. 6 are arranged in two planes, that is in an inner wiring plane 31 and in an outer wiring plane 30. Arranged between the wiring planes 30 and 31 is an insulating layer 32. The outer wiring plane 30 is covered by a solder resist layer 16, which leaves only the external contact areas 17 free. Thus, on the external contact areas 17, external contacts (7) may be provided simultaneously for a number of electronic components.

Figure 7:
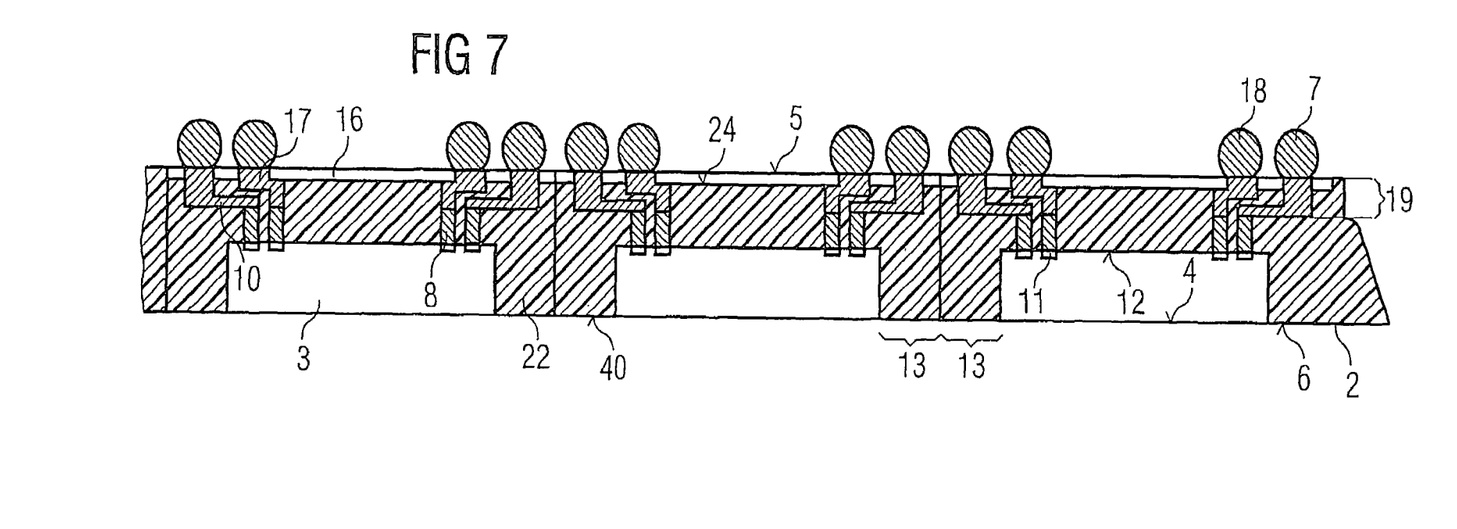
FIG. 7 shows a schematic cross section through the carrier from FIG. 6, after external contacts have been applied on its upper side.

FIG. 7 shows a schematic cross section through a carrier 22 of plastic package molding compound 9 with external contacts 7 applied on the upper side 24 of the carrier 22. Components with the same functions as in the previous figures are designated by the same reference numerals and are not separately explained.

In FIG. 7, the self-supporting carrier 22 has been freed of its mold plate 21 and adhesive film 34, as are represented in FIGS. 4 to 6. While the upper side 24 of the carrier 22 in FIG. 7 already has solder balls 18 as external contacts 8, on the underside 40 of the carrier 22 regions with plastic package molding compound 9 and regions with the rear sides 4 of the semiconductor chips 3 alternate. Here, the semiconductor chips 3 are arranged in rows and columns, with the result that the carrier 22 can be separated to form electronic components without any great effort.

Figure 8:
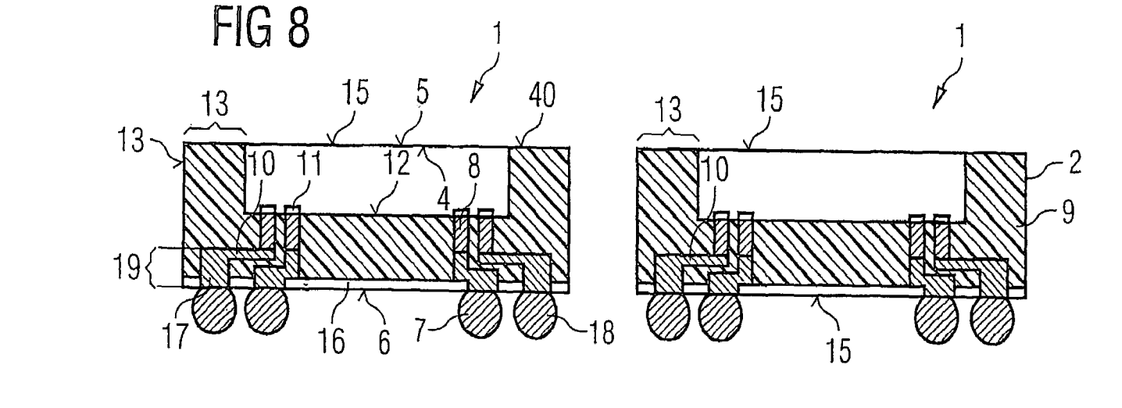
FIG. 8 shows a schematic cross section through two electronic components which have been produced after the separation of the carrier from FIG. 7 into individual components.

FIG. 8 shows a schematic cross section through two electronic components 1 after the separation of the carrier 22 of plastic package molding compound 9 into individual components according to FIG. 2. Components with the same functions as in the previous figures are designated by the same reference numerals and are not separately explained.

By a separating step, for example by sawing, laser-vaporizing or dry etching, the carrier 22 shown in FIG. 7 is separated into the individual components shown in FIG. 8. When plain saw blades are used, the right-angled forms of plastic package shown are produced.

Instead of such right-angled forms of plastic package with correspondingly steep side edges of the electronic components 1, it is also possible in an exemplary embodiment not shown here for any desired contours of the side edge 13 to be produced by profile sawing. Depending on the number of external contacts 7 required, the side edges may also be represented wider or narrower than is represented in FIG. 8. There is consequently a wide range of variation for the shaping of the form of package. The number of external contacts 7 may also be increased as desired. Consequently, an extremely wide variety of requirements imposed on the package structure of an electronic component 1 can be satisfied.

Figure 9:
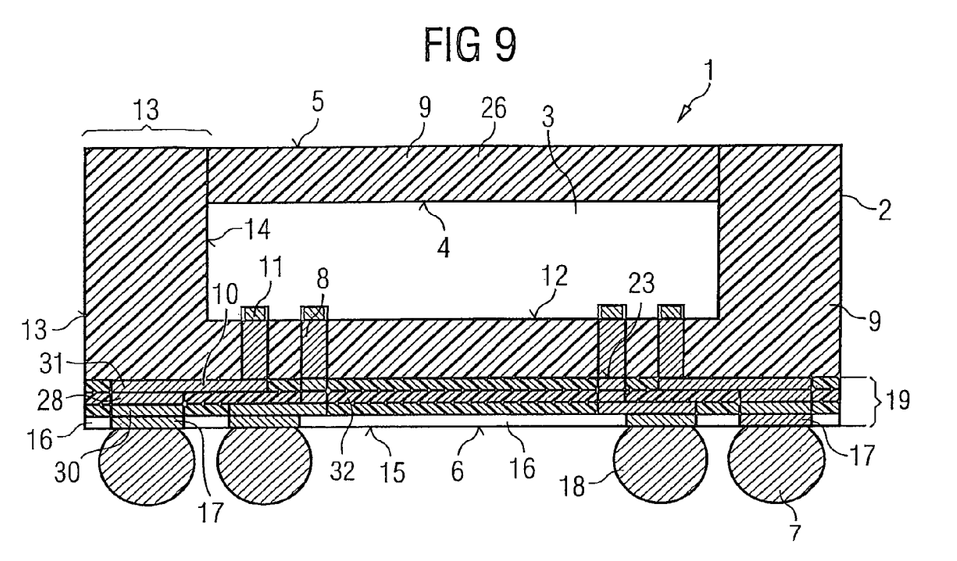
FIG. 9 shows a schematic cross section through a third electronic component according to the invention.

FIG. 9 shows a schematic cross section through an electronic component 1 according to a third embodiment of the invention. Components with the same functions as in the previous figures are designated by the same reference numerals and are not separately explained.

In the first and second embodiments of the invention according to FIG. 1 and FIG. 2, the rear side 4 of the semiconductor chip 3 forms an external contact area on the upper side 5 of the electronic component 1. Unlike there, the rear side 4 of the semiconductor chip 3 of the third embodiment according to FIG. 9 is protected by a coating 26 of plastic package molding compound 9. As in the case of the second embodiment, arranged on the underside of the electronic component 1 of the third embodiment according to FIG. 9 is a multi-layered interconnect structure 19.

In an exemplary embodiment not shown here, as in the case of the first embodiment according to FIG. 1, arranged on the underside of the electronic component is a multi-layered interconnect structure 19.

Figure 10:
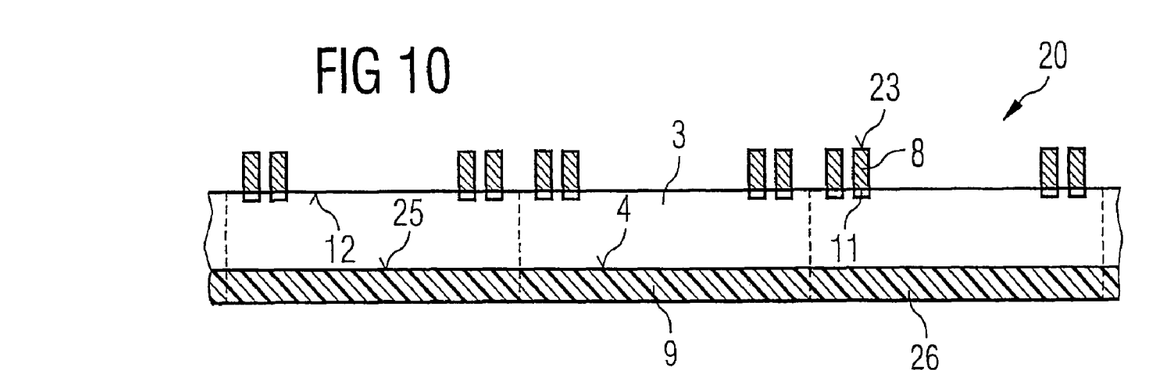
FIG. 10 shows a schematic cross section through a semiconductor wafer, with contact pillars applied on contact areas and with a coating of a plastic package molding compound applied on its underside.

FIG. 10 shows a schematic cross section through a semiconductor wafer 20 with contact pillars 8 applied on contact areas 11 and with coatings 26 of plastic package molding compound 9 applied on the underside of the semiconductor wafer 20 in the course of the production of the third embodiment of the invention. Components with the same functions as in the previous figures are designated by the same reference numerals and are not separately explained.

To protect the rear side 4 of the semiconductor chips 3, after the contact pillars 8 have been applied on the contact areas 11 on the upper side of the semiconductor wafer 20, its underside 25 is coated with a plastic package layer 26. This coating may be applied by dispension or by an injection-molding operation to the entire rear side of the semiconductor wafer 20. In this way, the rear side of the semiconductor chip 3 is protected by a coating 26 of plastic package molding compound 9 simultaneously for many electronic components 1 of the semiconductor wafer 20.

Figure 11:
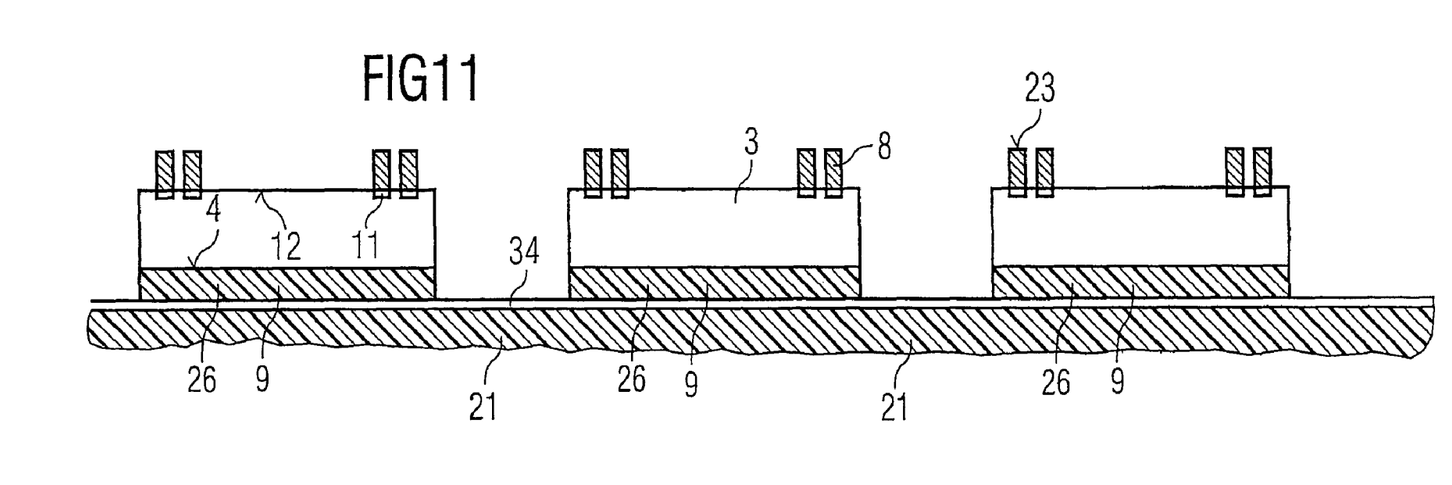
FIG. 11 shows a schematic cross section through a number of semiconductor chips of the semiconductor wafer from FIG. 10, with contact pillars applied on contact areas, the semiconductor chips with their coating provided on the underside being arranged on a mold plate.

FIG. 11 shows a schematic cross section through a number of semiconductor chips 3, with contact pillars S applied on contact areas 11, which chips are arranged with their coatings 26 of plastic package molding compound 9 of the respective underside on a mold plate 21 in the course of the production of the third embodiment of the invention. Components with the same functions as in the previous figures are designated by the same reference numerals and are not separately explained.

For receiving the semiconductor chips 3, in this embodiment of the invention the mold plate 21 has a double-sided adhesive film 34, with which the positions of the semiconductor chips 3 with their coating 26 of plastic package molding compound 9 are fixed. Subsequently, a mold piece, not represented here, with a cavity, the upper wall of which has a sealing film, is applied to the mold plate 21. The upper sides 23 of the contact pillars 28 can work themselves into this sealing film. After that, the cavity is filled with a plastic package molding compound and the mold is removed.

Figure 12:
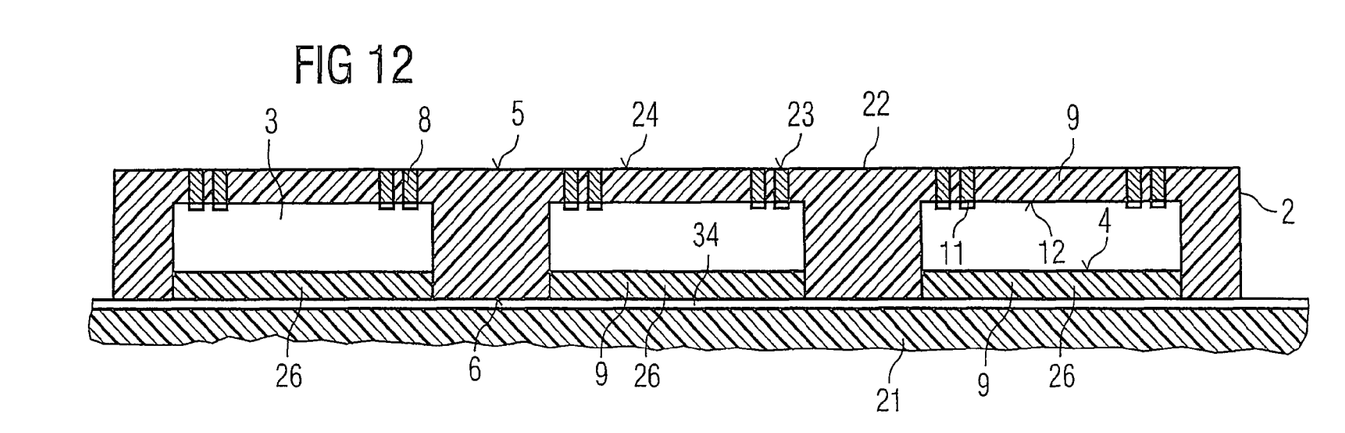
FIG. 12 shows a schematic cross section through a carrier of plastic package molding compound, with the semiconductor chips from FIG. 11 embedded therein.

FIG. 12 illustrates this state. After that, there is a carrier 22 of plastic package molding compound on the mold plate 21. In this case, the applied plastic package molding compound is combined with the coating of plastic package molding compound 9 to form a unit, with the result that the semiconductor chips 3 are embedded completely in plastic package molding compound 9.

FIG. 12 shows a schematic cross section through a carrier 22 of plastic package molding compound 9 with embedded semiconductor chips 3 in the course of the production of the third embodiment of the invention. Components with the same functions as in the previous figures are designated by the same reference numerals and are not separately explained.

In FIG. 12, the carrier 22 of plastic package molding compound 9 is still arranged on the mold plate 21. The carrier 22 is in this case formed in a self-supporting manner, with the result that it can be removed from the mold plate 21 at any time. On the upper side 24 of the carrier 22, the upper sides 23 of the contact pillars 8 are freely accessible, with the result that wiring lines can be applied to these microscopically small areas 23, in order to form macroscopically large external contact areas.

Figure 13:
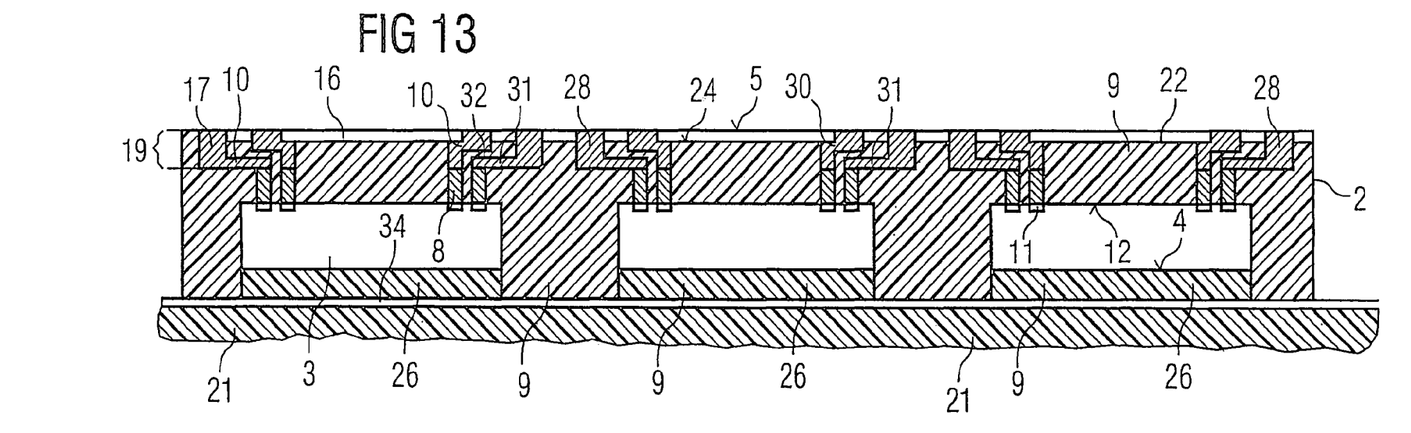
FIG. 13 shows a schematic cross section through the carrier from FIG. 12, wiring lines and contact vias being arranged on the carrier.

FIG. 13 shows a schematic cross section through the carrier 22 from FIG. 12, with wiring lines 10 and contact vias 28 arranged on the carrier 22.

In the case of the third embodiment of the invention, a multi-layered interconnect structure 19 is applied to the upper side 24 of the carrier 22. For this purpose, firstly an inner wiring plane 31 is applied, by copper, gold, silver or alloys of the same being deposited on the upper side 24 of the carrier 22 and subsequently structured. After that, an insulating layer 32 is deposited or applied on the structured inner wiring plane 31, leaving through-openings free, and the through-openings are subsequently metallized, with the result that contact vias 28 which lead through the insulating layer 32 are produced. Finally, the outer wiring plane 30, which may consist of the same materials as the inner wiring plane, is applied on the insulating layer 32. Finally, the outer wiring plane 30 is covered by a solder resist, with external contact areas 17 being left free, in order that material of the external contacts 7 to be applied does not wet the wiring lines 10.

Figure 14:
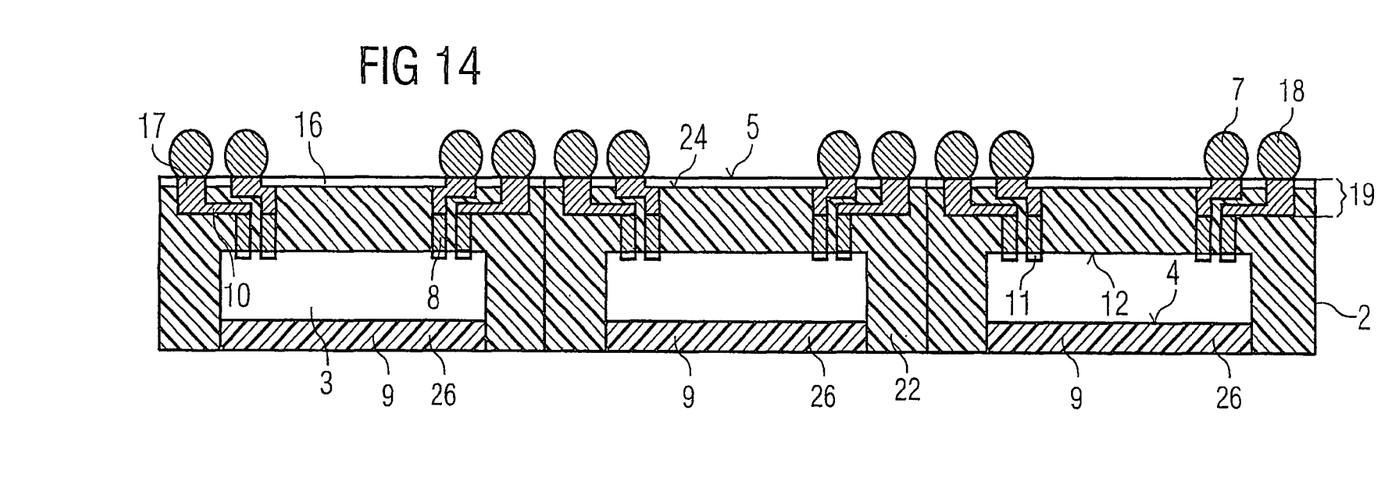
FIG. 14 shows a schematic cross section through the carrier from FIG. 13, external contacts being provided on its upper side.

FIG. 14 shows a schematic cross section through the carrier 22 from FIG. 13, with external contacts 7 applied on the upper side 24 of the carrier 22.

In this third embodiment of the invention, in a way similar to in the case of the first two embodiments of the invention, solder balls 18 are applied to the external contact areas 17 on the upper side of the carrier 22, in order to produce external contacts 7. By applying the solder balls 18 on the entire carrier, all the electronic components 1 are produced and, in a further step, are separated into individual components. In this case, by contrast with the previous embodiments, the rear side of each semiconductor chip 3 is now coated with a plastic package molding compound 9. As shown in FIG. 10, this coating 26 can be applied for all the semiconductor chips 3 at once to the underside of a semiconductor wafer 20.

Figure 15:
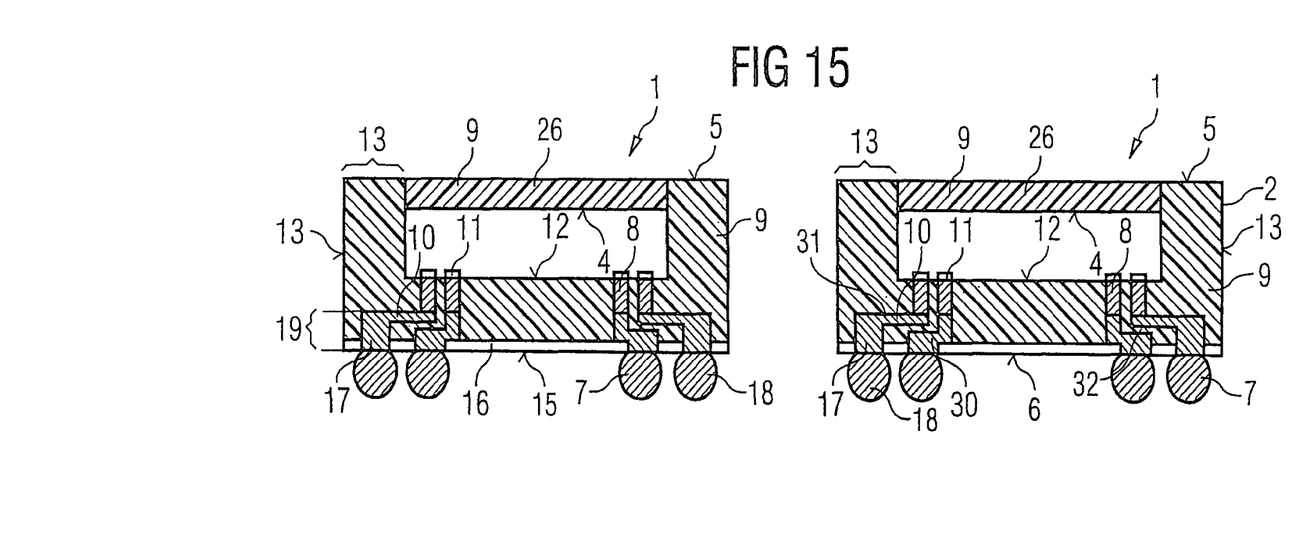
FIG. 15 shows a schematic cross section through two electronic components which are produced by separating the carrier from FIG. 14.

FIG. 15 shows a schematic cross section through two electronic components 1 after the separation of the carrier 22 from FIG. 14 into individual components.

After the separation of the carrier 22 from FIG. 14 into individual electronic components 1, as can be seen in FIG. 15, a package which completely embeds the semiconductor chip 3 is available. At the same time, an electronic component 1 which has no bonding wires and also no contact bumps, as in the case of flip-chip technology, on the upper side of the semiconductor chip 3 is consequently realized. The entire connection technology is consequently more reliable and less susceptible to vibrations and other loads of the electronic component 1.

Figure 16:
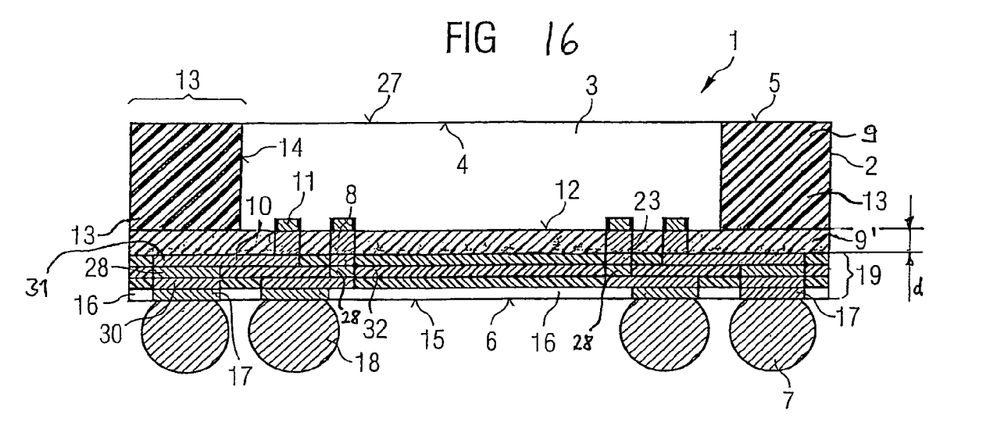
FIG. 16 shows a schematic cross section through a fourth electronic component according to the invention.

FIG. 16 shows a schematic cross section through a fourth electronic component 1 according to the invention, with a plastic package 2 which has a plastic molding compound 9 and a layer of plastic 9'. Components with the same functions as in the previous FIG. are designated by the same reference numerals and are not separately explained.

The plastic molding compound 9 surrounds the side edges 14 of the semiconductor chip 3 and forms side edges 13, which may be made larger to any desired extent than the side edges 14 of the semiconductor chip 3. The electrically insulating layer of plastic 9' is arranged on the active upper side 12 of the semiconductor chip 3 and on the side edges 13 of plastic molding compound 9 and bridges the transitional region between the side edges 13 and the semiconductor chip 3. The contact areas 11 of the semiconductor chip 3 are not covered by the layer of plastic 9'.

The layer of plastic 9' carries a first wiring plane 30 and a second wiring plane 31, which are electrically connected to the contact areas 11 of the semiconductor chip 3 by means of contact vias 28 formed as contact pillars 8. The contact pillars 8 and/or the contact vias 28 together with the wiring plane 30 may comprise galvanically or chemically deposited metal.

The layer of plastic 9' has a thickness d which is less than or equal to 30 μm. In an exemplary embodiment not shown here, the thickness d is less than or equal to 20 μm, which can be brought about, for example, by a grinding operation, which produces a very level surface. In this case, the first wiring plane 30 may also be arranged directly on an uppermost passivation layer of the semiconductor chip 3, formed as a layer of plastic 9', whereby the thickness d of the layer of plastic 9' becomes very small, virtually 0 or even equal to 0, i.e, there is then no further insulating layer any longer outside the passivation layer. Further wiring planes may be provided above the first wiring plane 30 and the second wiring plane 31.

As a departure from the component 1 from FIG. 16, a further exemplary embodiment, not shown here, has only a first wiring plane 30 and no second wiring plane 31.

A number of implementations have been described. Nevertheless, it will be understood that various modifications may be made without departing from the spirit and scope. Accordingly, other embodiments are within the scope of the following claims.

The invention claimed is:

1. A method for producing an electronic component with a plastic package, in which a semiconductor chip is arranged, the method comprising:
   providing a semiconductor wafer, the semiconductor wafer having semiconductor chips, with contact areas, arranged in rows and columns;
   elevating the contact areas to form contact pillars on the semiconductor wafers;
   separating the semiconductor wafer into individual semiconductor chips with contact pillars on the contact areas;
   loading a mold plate with the semiconductor chips;
   producing a common carrier from plastic package molding compound on the mold plate for the semiconductor chips, the semiconductor chips being embedded into the plastic package molding compound in such a way that the upper sides of the contact pillars opposite the contact areas are arranged such that the upper sides remain free on an upper side of the carrier;
   selectively applying wiring lines on the common carrier a first line end of each wiring line, respectively, being connected to the upper side of the contact pillar and a second line end leading to an external contact area;
   selectively applying a solder resist to the upper side of the carrier such that the external contact areas of the wiring lines are free;
   applying solder balls to the external contact areas; and
   separating the carrier into individual electronic components.

2. The method as claimed in claim 1, wherein an underside of the semiconductor wafer is provided with a coating of plastic package molding compound before the separation into semiconductor chips.

3. The method as claimed in claim 1, wherein elevation of the contact areas to form contact pillars on the semiconductor chip is by metal deposition through a mask.

4. The method as claimed in claim 1, wherein elevation of the contact areas to form contact pillars on the semiconductor chip is by selective electrolytic metal deposition through a mask.

5. The method as claimed in claim 1, wherein elevation of the contact areas to form contact pillars on the semiconductor chip is by a printing technique.

6. The method as claimed in claim 1, wherein elevation of the contact areas to form contact pillars on the semiconductor chip is by metal sputtering through a mask.

7. The method as claimed in claim 1, wherein elevation of the contact areas to form contact pillars on the semiconductor chip is by a vapor-depositing technique and subsequent selective technique of etching the vapor-deposited metal.

8. The method as claimed in claim 1, wherein the elevation of the contact to form contact pillars on the semiconductor chip is by applying bonding heads, to the contact areas.

9. The method as claimed in claim 1, wherein production of a common carrier from plastic package molding compound for the semiconductor chips on the mold plate is by an injection-molding technique with the aid of a mold.

10. The method as claimed in claim 1, wherein production of a common carrier from plastic package molding compound for the semiconductor chips on the mold plate is by a centrifugal casting technique.

11. The method as claimed in claim 1, wherein selective application of wiring lines to the common carrier of plastic package molding compound is by applying a closed metal layer, and structuring of the metal layer by a photoresist technique.

12. The method as claimed in claim 1, wherein selective application of wiring lines to the common carrier of plastic package molding compound is by a printing technique.

13. The method as claimed in claim 1, wherein selective application of a solder resist to the upper side of the carrier, while leaving the external contact areas of the wiring lines free, is by a photoresist technique.

14. The method as claimed in claim 1, further comprising: producing the wiring lines from the contact pillars to the external contacts on the upper side of the electronic components by applying multi-layered interconnect structures on the upper side of the common carrier.

15. The method as claimed in claim 14, further comprising:
producing multi-layered interconnect structures microtechnology.

16. The method as claimed in claim 1, wherein the elevation of the contact to form contact pillars on the semiconductor chip is by applying thermosonic compression heads, to the contact areas.

17. The method as claimed in claim 1, wherein selective application of wiring lines to the common carrier of plastic package molding compound is by a screen printing technique.

18. The method as claimed in claim 14, further comprising producing multi-layered interconnect structures printed circuit board technology.

19. A method for producing an electronic component with a plastic package in which a semiconductor chip is arranged, the method comprising:
providing a semiconductor wafer, the semiconductor wafer having semiconductor chips with contact areas arranged in rows and columns;
elevating the contact areas to form contact pillars on the semiconductor wafer;
separating the semiconductor wafer into individual semiconductor chips with contact pillars on the contact areas;
loading a mold plate with the semiconductor chips;
producing a common carrier from plastic package molding compound on the mold plate for the semiconductor chip, the semiconductor chips being embedded into the plastic package molding compound in such a way that upper sides of the contact pillars opposite the contact areas are arranged such that the upper sides remain free on an upper side of the carrier;
selectively applying wiring lines on the common carrier a first line end of a each wiring line, respectively, being connected to the upper side of the contact pillar and a second line end leading to an external contact area;
selectively applying a solder resist to the upper side of the carrier such that the external contact areas of the wiring lines are free;
applying solder balls to the external contact areas; and
separating the carrier into individual electronic components.

20. The method as claimed in claim 19, wherein an underside of the semiconductor wafer is provided with a coating of plastic package molding compound before the separation into semiconductor chips.

21. The method as claimed in claim 19, wherein elevation of the contact areas to form contact pillars on the semiconductor chip is by metal deposition through a mask.

22. The method as claimed in claim 19, wherein elevation of the contact areas to form contact pillars on the semiconductor chip is by selective electrolytic metal deposition through a mask.

23. The method as claimed in claim 19, wherein elevation of the contact areas to form contact on the semiconductor chip is by a printing technique.

24. The method as claimed in claim 19, wherein elevation of the contact areas to form contact pillars on the semiconductor chip is by metal sputtering through a mask.

25. The method as claimed in claim 19, wherein elevation of the contact areas form contact pillars on the semiconductor chip is by a vapor-depositing technique and subsequent selective technique of etching the vapor-deposited metal.

26. The method as claimed in claim 19, wherein the elevation of the contact to form contact pillars on the semiconductor chip is by applying bonding heads to the contact areas.

27. The method as claimed in claim 19, wherein the elevation of the contact to form contact pillars on the semiconductor chip is by applying thermosonic compression heads, to the contact areas.

28. The method as claimed in claim 19, wherein production of a common carrier from plastic package molding compound for the semiconductor chips on the mold plate is by an injection-molding technique with the aid of a mold.

29. The method as claimed in claim 19, wherein production of a common carrier from plastic package molding compound for the semiconductor chips on the mold plate is by a centrifugal casting technique.

30. The method as claimed in claim 19, wherein selective application of wiring lines to the common carrier of plastic package molding compound is by applying a closed metal layer, and structuring of the metal layer by a photoresist technique.

31. The method as claimed in claim 19, wherein selective application of wiring lines to the common carrier of plastic package molding compound is by a printing technique.

32. The method as claimed in claim 19, wherein selective application of wiring lines to the common carrier of plastic package molding compound is by a screen printing technique.

33. The method as claimed in claim 19, wherein selective application of a solder resist to the upper side of the carrier, while leaving the external contact areas of the wiring lines free, is by a photoresist technique.

34. The method as claimed in claim 19, further comprising:
producing the wiring lines from the contact pillars to the external contacts on the upper side of the electronic components by applying multi-layered interconnect structures on the upper side of the common carrier.

35. The method as claimed in claim 34, further comprising:
producing multi-layered interconnect structures microtechnology.

36. The method as claimed in claim 34, further comprising:
producing multi-layered interconnect structures printed circuit board technology.

* * * * *